United States Patent [19]

Leis

[11] Patent Number: 4,928,075
[45] Date of Patent: May 22, 1990

[54] MULTIPLE BANDWIDTH FILTER SYSTEM FOR PHASE LOCKED LOOP

[75] Inventor: Michael D. Leis, Framingham, Mass.

[73] Assignee: Digital Equipment Corporation, Maynard, Mass.

[21] Appl. No.: 371,494

[22] Filed: Jun. 26, 1989

[51] Int. Cl.$^5$ .................. H03H 21/00; H03L 7/10
[52] U.S. Cl. .................................. 331/17; 328/167; 333/174
[58] Field of Search ............. 331/17, 14; 328/167; 333/174; 360/37.1

[56] References Cited

U.S. PATENT DOCUMENTS 3,909,735  9/1975  Anderson et al. ............. 331/17 X
4,319,207  3/1982  Gignoux ......................... 328/167 X Primary Examiner—Siegfried H. Grimm
Attorney, Agent, or Firm—Neuman, Williams, Anderson & Olson

[57] ABSTRACT

A method and apparatus for combining a plurality of different filtering paths of varying bandwidth to provide selectable bandwidth signal filtering without transients caused by initialization of filter components. The signal to be filtered is applied to a plurality of parallel connected passband filters ranging from a widest passband filter to a narrowest passband filter. The bandwidth of the parallel filter combination is progressively narrowed by sequentially holding the output level of each of the filters in declining order of their passband frequency range, beginning with the widest passband filter, until all of the output levels of the filters are held constant except for the narrowest passband filter. This filter system is especially adapted for use as a loop filter in a phase locked loop control system incorporated in a data storage disc drive.

24 Claims, 6 Drawing Sheets

MULTIPLE BANDWIDTH FILTER SYSTEM FOR PHASE LOCKED LOOP

FIELD OF THE INVENTION

The present invention relates to filter systems, and more particularly to multiple bandwidth filtration systems suitable for use in feedback control loops.

BACKGROUND OF THE INVENTION

Feedback control loops, and particularly phase-locked loops, often benefit from the utilization of variable bandwidth filtration to secure the combination of rapid initial control acquisition and subsequent tracking noise rejection.

For instance, in the case of information storage unit drives which use magnetic disc type storage media, it is common to include a phase-locked feedback control loop which comprises a phase-locked variable frequency oscillator (VFO) system which is locked in phase to a signal retrieved from the storage disc in the drive. The phase-locked loop (PLL) typically generates a control signal proportional to phase error between a signal which is read from the disc, a PLL reference signal, and a signal generated by a voltage-controlled oscillator (VCO). The PLL control signal is used to shift the frequency of the VCO to reduce the detected phase error difference to an acceptably low level. The output of the VCO is used to supply clocking that allows data detection. Filters are included in this feedback control system to tailor the response time of the VCO output signal to changes on the input.

It is generally desirable to provide a wide bandwidth for the PLL control signal to provide a rapid acquisition for the PLL control system. The wide bandwidths and high PLL control system gain necessary for this purpose are achievable with good system design. However, such high bandwidths and gain cause the VCO to vary in phase and frequency in proportion to PLL control signal noise which is generated by noise in the PLL reference signal. This noise can then cause corresponding extraneous high frequency phase shift of the VCO signal, which can cause undesirable effects.

Therefore, once the VCO is locked to the PLL reference frequency after the beginning of the preamble field is read, it is desirable to reduce the bandwidth of the PLL control signal for the remainder of the preamble field to eliminate this high frequency noise. Generally, the additional bandpass filtering necessary for this purpose is minimal since the preamble field contains only the single frequency PLL control signal. However, the data field includes a wide range of signal frequency components which introduce large peak phase shift noise on the PLL reference signal, which causes amplitude noise on the PLL control signal. Furthermore, since the VCO is already locked onto the PLL reference signal by the time that the data field is read from the disc, only long term variations in phase shift need be corrected. Consequently, relatively narrow bandpass filtering is desirable while the data field is read to discriminate against noise, since the limited bandwidth then has no adverse effect upon maintaining PLL control.

The multiple bandpass filter systems according to the prior art generally can provide such response characteristics, but they all have significant disadvantages. They typically use a master filter with characteristics to define the maximum PLL control signal bandwidth during acquisition, with one or more auxiliary filters to successively couple onto the master filter for progressively reducing the PLL control signal bandwidth. The switching process between the master filter and the auxiliary filters causes serious discontinuities in the output of the filter system. This is because energy storage devices in the auxiliary filter systems must be charged to provide output levels matching the final value of the master filter before switching. Discontinuities cause transients in the output of the VCO. Such discontinuities can be minimized by initializing the energy storage components. Circuits for initializing the energy storage devices, which are typically larger than the master filter, are complex, and active devices for rapidly charging the energy storage devices, such as high speed operational amplifiers, are very expensive, or are of high power and unsuitable for integrated circuits. The discontinuities can also be minimized by just reducing the gain of the system, which causes a reduction in system bandwidth, but this also causes the "damping" of the system to be reduced. Insufficient system damping allows excessive overshoot response.

SUMMARY OF THE INVENTION

In the preferred embodiment, the present invention uses a PLL control system with three different bandwidth filters for PLL control signal filtration, a widest bandwidth filter, an intermediate bandwidth filter with a bandwidth within the passband of the widest bandwidth filter, and a narrowest bandwidth filter with a bandwidth within the passband of the intermediate bandwidth filter, and which three filters effectively operate in parallel to filter the PLL control signal. The widest bandwidth filter dominates the PLL control loop during acquisition because of its faster response and lower attenuation factor, and fast alignment of the phase of the VCO during the first portion of the preamble field.

During this period, the output of the widest bandwidth filter also cancels the output errors of the intermediate and narrowest bandwidth filters, which errors occur due to their slower integration of the PLL control signal. After the VCO is locked to the PLL reference signal in the first portion of the preamble field, the bandwidth of the filter system is effectively switched to the bandwidth of the intermediate frequency filter for the remainder of the preamble field by "freezing" the output of the widest bandwidth filter. The level of the widest bandpass filter so held then cancels the combinational level errors of the intermediate and narrow bandwidth filters while effectively removing the widest bandwidth filter from the system. Thus, no final value discontinuity level shifts due to the non-initialized energy storage elements can occur. The intermediate bandwidth filter then dominates the PLL control loop because it has a faster response and lower attenuation factor than the narrowest bandwidth filter. The bandwidth of the intermediate filter is sufficiently wide to permit accurate phase locking to the PLL reference signal in the later part of the preamble field, but narrow enough to filter out extraneous noise. The intermediate bandwidth filter output substantially cancels the error of the narrowest bandwidth filter because of its wider bandwidth and lower attenuation factor.

At the start of the data field, the output of the intermediate bandwidth filter is "frozen" to effectively remove it from the system to let the narrowest PLL filter dominate the PLL control loop. The level of the intermediate bandwidth filter so held again cancels the output level error of the narrowest bandwidth filter, so no final value discontinuity level shifts occur. The bandwidth of the narrowest bandwidth filter is narrow enough to effectively filter out the high level of noise from the PLL reference signal while the data field is read, yet wide enough to maintain the phase-locked control mode through the remainder of the data field.

DETAILED DESCRIPTION OF THE PREFERRED EMBODIMENT

Figure 1:
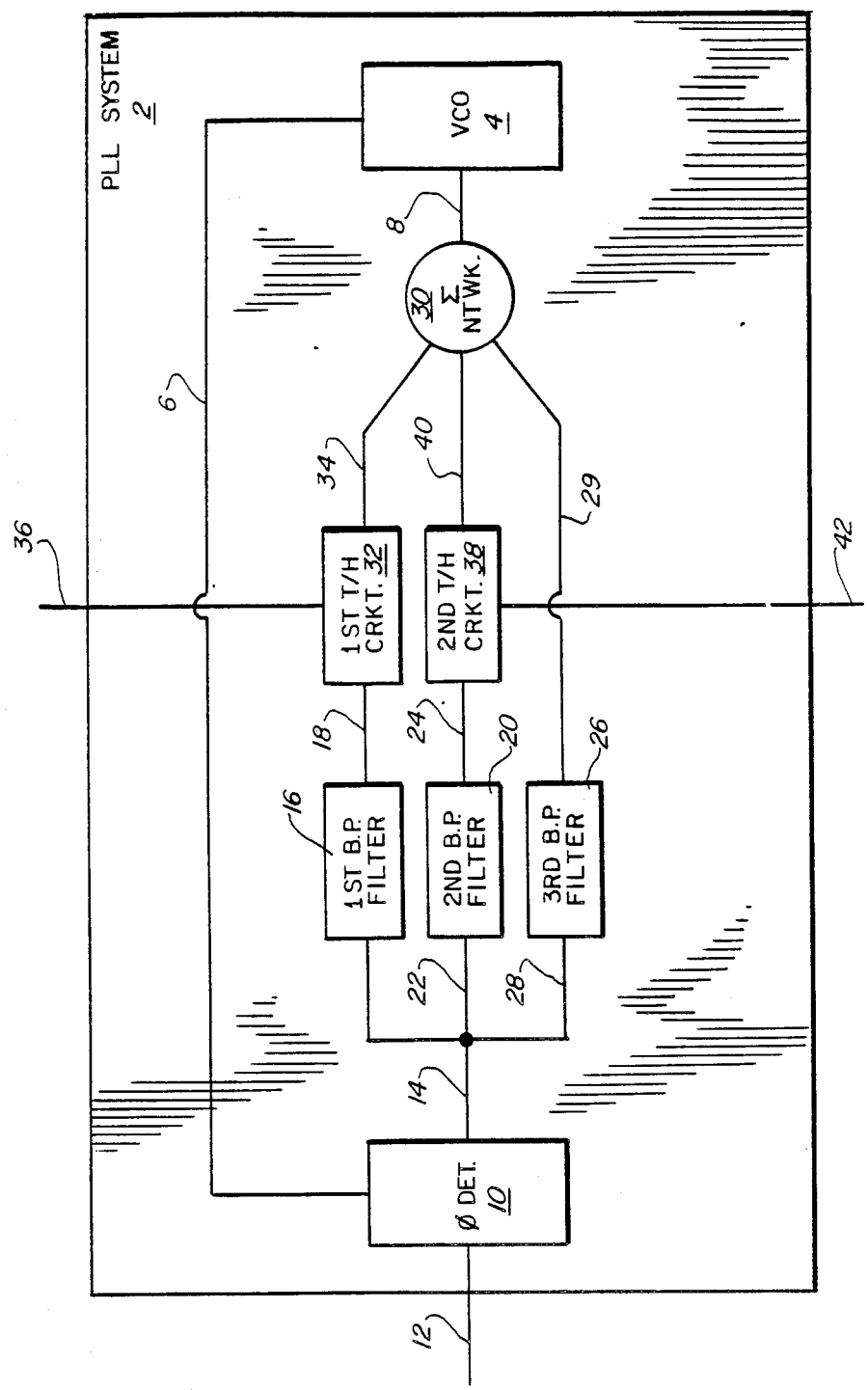
FIG. 1 is a block diagram for a preferred embodiment of the invention.

Referring to the drawings, wherein like characters designate like or corresponding parts throughout the views, FIG. 1 shows a phase-locked-loop (PLL) control system 2 which includes the present invention. The PLL system 2 includes a voltage-controlled oscillator (VCO) 4 which has a variable-frequency output signal on a VCO output line 6. The VCO 4 changes its output signal on the line 6 in proportion to changes in amplitude of a filtered phase-locked-loop (PLL) control signal on a VCO input line 8.

A PLL reference signal read from a disc in the drive is fed to a PLL reference signal input on a phase detector 10 via a line 12. The VCO output signal on the line 6 is also fed to a VCO input on the phase detector 10. The phase detector 10 produces a phase detector output signal on a phase detector output line 14. The output signal on the line 14 is proportional to the difference in phase between the PLL reference signal on the line 12 and the VCO signal on the line 6.

The phase detector output signal on the line 14 is also fed to a first bandpass filter 16. The first bandpass filter 16 has a first filter output signal on a first filter output line 18. Likewise, the phase detector output signal on the line 14 is fed to a second bandpass filter 20 via a second filter input line 22, and the second filter 20 provides a second filter output signal on a second filter output line 24. Similarly, the phase detector output signal on the line 14 is fed to a third bandpass filter 26 via a third filter input line 28, and the third filter 26 provides a third filter output signal on a third filter output line 29. The first filter 16, the second filter 20 and the third filter 26 all have different bandpass characteristics from each other.

Typically, the first filter 16 provides a minimal amount of bandpass filtering and attenuation, and only includes sufficient high frequency filtration to permit the PLL system 2 to discriminate the PLL reference signal from high frequency noise. This filter is suitable for rapid acquisition at the beginning of the preamble of a disc sector. The second filter 20 most advantageously includes a narrower bandpass with a higher attenuation factor than that of the first filter 16. This narrower bandpass smooths out high frequency noise in the remainder of the preamble so that the PLL system 2 does not shift the phase of the VCO 4 in response to noise. The PLL reference signal on the line 12 acquires a great deal more noise when the data field is read, and the second filter 20 does not have a sufficiently narrow bandwidth to allow the PLL system 2 to discriminate against this noise. Since the VCO output signal on the line 6 is locked to the PLL reference signal on the line 12 while the preamble field is read, the system correction necessary to maintain PLL control is relatively gradual for the remainder of the read process. Therefore, the third filter 26 most advantageously has a bandwidth that is only wide enough to pass the low frequency variations of the PLL control signal on the line 14 due to VCO phase shift or drift, to provide maximum discrimination of noise in the PLL reference signal on the line 12.

The prior art difficulty with final value discontinuities caused by filter switching of filter outputs for different bandwidths is solved by the present invention as follows. The third filter output signal on the line 29 is fed to a first input of a three input summing network 30. The first filter output signal on the line 18 is fed to a conventional well known first track/hold circuit 32 which produces a first track/hold output signal on a first track/hold output line 34. The first track/hold output signal on the line 34 selectively tracks the first filter output signal on the line 18 or holds a steady state value of the first filter output signal on the line 18 at any particular moment in response to a first hold control signal fed to the first track/hold circuit 32 on a first hold control input line 36. Likewise, the second filter output signal on the line 24 is fed to a conventional well known second track/hold circuit 38 which produces a second track/hold output signal on a second track/hold output line 40. The second track/hold output signal on the line 40 selectively tracks the second filter output signal on the line 24 or holds a steady state value of the first filter output signal on the line 24 at any particular moment in response to a second hold control signal fed to the second track/hold circuit on a second hold control input line 42. The first hold control signal on the line 36 and the second hold control signal on the line 42 are supplied by the disc drive controller (not shown) in a manner well known in the art. The first track/hold output signal on the line 34 is fed to a second input of the three input summing network 30. The second track/hold output signal on the line 40 is fed to a third input of the three input summing network 30. The output of the summing network 30 provides the VCO input signal on the line 8.

The first filter element 16, the second filter element 20 and the third filter element 26 all comprise conventional bandpass filter network elements, such as resistors, capacitors, and inductors in combinations and of such values that provide desired response characteristics. The first filter 16 has a faster response and a lower attenuation factor than the second filter 20, and the second filter 20 has a faster response and a lower attenuation factor than the third filter 26, due to the progressively greater filtration of each of the filters. Consequently, when the first filter 16, the second filter 20 and the third filter 26 are all filtering the same phase detector output signal from the line 14, the characteristic of the first filter 16 dominates the PLL control loop. Similarly, if the first filter 16 is effectively removed from the circuit, the characteristic of the second filter 20 dominates the PLL control loop. Finally, if the first filter 16 and the second filter 20 are effectively removed from the circuit, the characteristic of the third filter 26 will dominate the PLL control loop.

The present invention effectively removes the first filter 16, or both the first filter 16 and the second filter 20 from the PLL control loop with selective operation of the first track/hold circuit 32 and the second track/hold circuit 38. The operation of the first track/hold circuit 32 and he second track/hold circuit 38 "freezes" their outputs in response to their respective hold control input signals on the lines 36 and 42. This "freezing" of the filter outputs prevents final value discontinuites from being generated when the filter outputs are summed in the summing network 30. Thus, the VCO input signal on the line 8 generated by the summing network 30 contains no signal discontinuities due to the switching of filter networks to alter the PLL control loop characteristic.

For instance, when the first hold signal on the line 36 allows the first track/hold circuit 32 to let its output signal on the line 34 track the first filter output signal on the line 18, and the second hold signal on the line 42 allows the second track/hold circuit 38 to let its output signal on the line 40 to track the second filter output signal on the line 24, the signals which are summed by the summing network 30 correspond to the outputs of the first filter 16 on the line 18, the second filter 20 on the line 24 and the third filter on the line 29 combined, so that the VCO input signal on the line 8 represents the combination thereof.

In this case, because the bandwidth of the first filter 16 is greater, and its attenuation factor less than the corresponding bandwidths and attenuation factors of the second filter 20 and the third filter 26, the bandpass characteristic of the first filter 16 dominates the characteristics of the other filters, so that the VCO input signal on the line 8 essentially corresponds to the output of the first filter 16 on the line 18 alone. This operation is desirable for rapid frequency correction of the VCO output signal on the line 6 to match the frequency of the PLL reference signal on the line 20 during the beginning of the preamble of one of the disc sectors.

However, although the wide bandwidth of the first filter 16 is desirable for rapid frequency correction of the VCO output signal on the line 6, this bandwidth is not necessary for more than the first portion of the preamble field. Furthermore, it is desirable to reduce the bandwidth of the PLL control signal on the line 14 for the remainder of the preamble field so as to prevent noise in the PLL reference signal on the line 12 from causing the phase detector 14 to generate undesirable noise in the VCO output signal on the line 6.

To reduce the bandwidth of the PLL control loop for this purpose, the first hold control signal on the line 36 changes to "freeze" the output of the first track/hold circuit 32. From this moment, the output of the first track/hold circuit 32 remains steady state at the signal level which it was "frozen", and this frozen value is combined with the outputs corresponding to the second filter 20 and the third filter 26 in the summing network 30 to produce the VCO input signal on the line 8. Because the output of the first track/hold circuit 32 on the line 34 tracks the output of the first filter 16 on the line 18 until frozen by the first hold control signal on the line 36, and since the output of the first track/hold circuit 32 on the line 34 thereby cancels the cumulative output level error of the signals corresponding to the output of the second filter 20 on the line 24 and the third filter 26 on the line 29, the held output value of the first track/hold circuit 32 on the line 34 prevents final value discontinuities from occurring so that no initialization of the second filter 20 and third filter 36 is required when the filtering action of the first filter 16 is so inhibited.

By so "freezing" the output of the first track/hold circuit 32, the first filter 16 is effectively removed from the circuit and only the second filter 20 and the third filter 26 can affect the PLL control loop. Since the second filter 20 has a lower attenuation factor and wider bandwidth than the third filter 26, as explained above, the bandpass characteristics of the second filter 20 dominate the response of the PLL control loop. Thus, the PLL control system changes its bandwidth from that of the first filter 16 to that of the second filter 20 to improve system stability for the remainder of the preamble. Furthermore, slow variations in the output of the first track/hold circuit 32 on the line 34, due to "droop" errors in the first track/hold circuit 32, are regulated out by the action of the second filter 20 and the third filter 26.

Although the intermediate bandwidth of the second filter 20 is ideal for rapid phase shift correction of the VCO output signal on the line 6 while the preamble field is read, the much higher noise level associated with the PLL reference signal on the line 12 when the data field is read makes an even narrower bandwidth desirable to discriminate against noise. This is possible because the VCO output signal on the line 6 has already been corrected in frequency and phase in the preamble field, and only gradual correction is required by the PLL system 2 thereafter.

Therefore, after the preamble of the accessed disc is read, to reduce the bandwidth of the PLL control system 2 still further, the second hold control signal on the line 42 changes to "freeze" the output of the second track/hold circuit 32. From this moment, the output of the second track/hold circuit 32 remains steady state at the signal level at which it was "frozen", and this frozen value is combined with the outputs of the first track/hold circuit 32 and the third filter 26 in the summing network 30 to produce the VCO input signal on the line 8. Thus, no signal discontinuities in the VCO input signal on the line 8 occur when the filtering action of the second filter 20 is so inhibited.

By so "freezing" the output of the second track/hold circuit 38, the second filter 20 is effectively removed from the circuit like the first filter 16 as described above. Since the output of the first track/hold circuit 32 is still frozen, effectively removing the first filter 16 from the circuit as well, only the remaining third filter 26 can affect the PLL control loop. Thus, the PLL control system 2 changes its response from that of the second filter 20 to that of the third filter 26 to minimize the bandwidth of the PLL control system 2 for the remainder of the reading operation. Because the output of second filter 20 on the line 24 compensates for the output level error of the third filter 26 due to integration and the steady state level held by the output of the first track/hold circuit 32 on the line 34 until the second track/hold circuit 38 freezes its output on the line 40, these errors are consequently cancelled when the output of the second track/hold circuit 38 is held in response to the second hold control signal on the line 42.

Thus, no final value discontinuities are introduced when the second filter 20 is effectively removed from the circuit in this manner.

Consequently, for sequential three-step bandwidth reduction from a relatively wide bandwidth to a relatively narrow bandwidth, the first hold control signal on the line 36, and then the second hold control signal on the line 42 in combination with the first hold control signal on the line 36, are used to respectively freeze the output of first one, and then two, of the three progressively narrowing bandwidths provided by the first filter 16, the second filter 20 and third filter 26 without switching their outputs, so as to avoid output level errors in the form of final value signal discontinuities. Of course, when the first hold control signal on line 36 and second hold control signal on the line 42 are changed to release the outputs of the first track/hold circuit 32 and the second track/hold circuit 38 respectively, error can occur in the VCO input signal on the line 12. However, this event can only occur after completion of tracking, so the system operation is not adversely affected.

Figure 2:
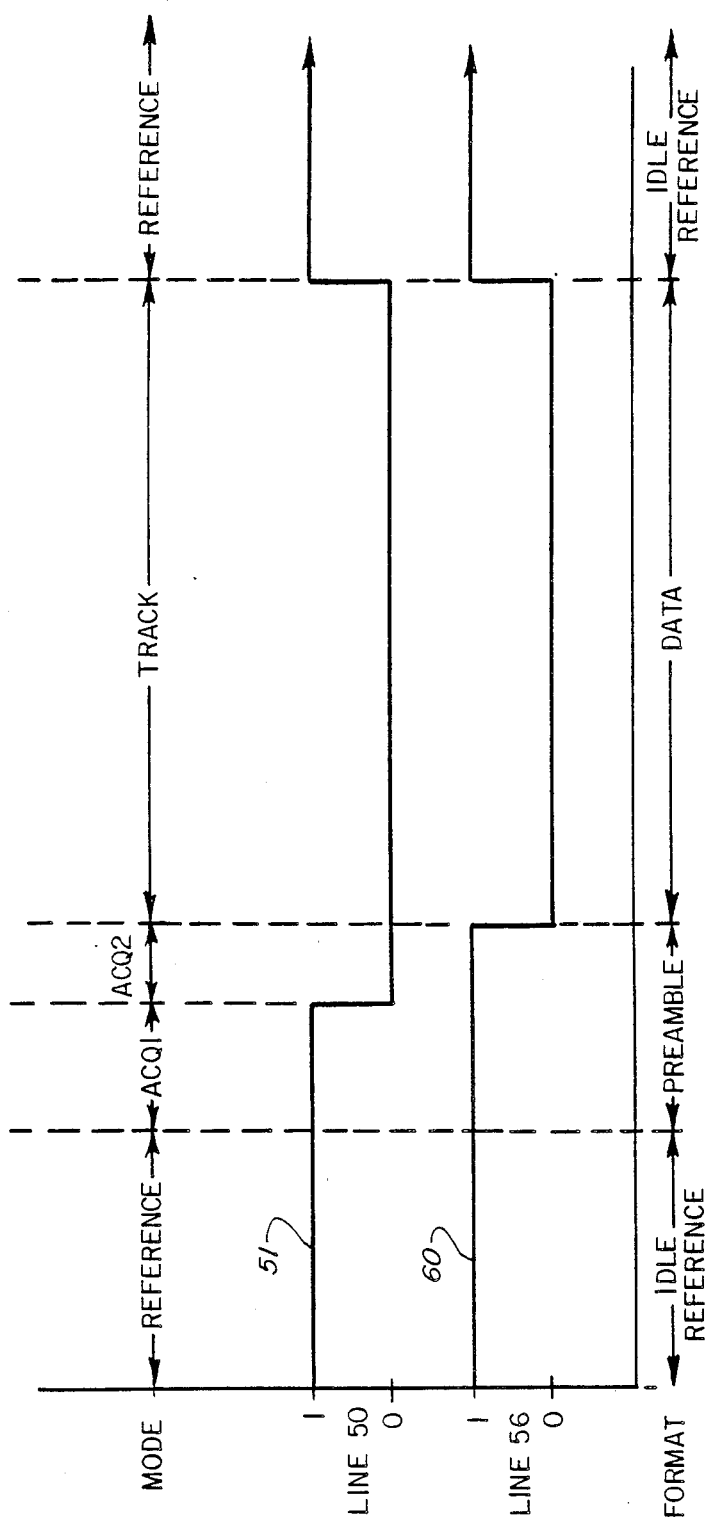
FIG. 2 is a graphical representation of control signal waveforms for the preferred embodiment of the invention shown in FIG. 1.

The first hold control signal on the line 36 and the second hold control signal on the line 42 are shown as a function of data format on the disc and the mode of the PLL control system 2 in FIG. 2. A first hold control signal waveform 51 represents the first hold control signal on the line 34. A second hold control signal waveform 60 represents the second hold control signal on the line 42. In FIG. 2, the first hold control signal waveform 51 and the second hold signal waveform 60 are indicated to have a level of "1" for the tracking mode and "0" for the holding mode. For instance, when the first hold control waveform 51 has a level of "1", the output of the first track/hold circuit 32 on the line 34 tracks the output of the first filter 16 on the line 18. When the first hold control signal waveform 51 has a level of "0", the output of the first track/hold circuit 32 on the output line 34 is held at the value of the output of the first filter 16 on the line 18 upon the transition of the waveform 51 from "1" to "0" occurs.

Likewise when the second hold control signal waveform 60 has a level of "1", the output of the second track/hold circuit 38 on the line 40 tracks the output of the second filter 20 on the line 24. When the second hold control signal waveform 60 has a level of "0", the output of the second track/hold circuit 38 on the line 40 is held at the value of the output of the second filter 20 upon the transition of the waveform 60 from "1" to "0". Of course, depending upon the specific configuration of the first track/hold circuit 32 and the second track/hold circuit 38, the shifts of their respective control signals represented by the waveform 51 and the waveform 60 may be reversed, if desired. Likewise, the shifts may represent values other than "1" and "0" as shown in FIG. 2.

In the preferred embodiment, the first hold waveform 51 and the second hold waveform 60 are asserted at the "1" level during the "Idle-Reference" period, which represents the period before the preamble of a selected disc sector is read. The first hold waveform 51 is so asserted until at least the first portion of the preamble is read, represented by the first portion of the "acquisition" mode, abbreviated "Acq. 1." The first hold waveform 51 is then shifted to the "0" level for the remainder of the preamble field and associated data field. This duration is shown as encompassing the acquisition mode for the remainder of the preamble period, abbreviated "Acq. 2" as well as for the entire tracking mode during the period of the data field.

The second hold waveform 60 is asserted at the "1" level until the end of the preamble field is read, thus encompassing the entire reference and acquisition mode periods. The second hold waveform 60 is then shifted to the "0" level for the entire tracking mode during the period of the data field. When the read operation terminates, the first hold waveform 51 and the second hold waveform 60 are then shifted back to the "1" level for beginning the subsequent standby and read process, as shown in FIG. 2.

The preferred embodiment as described above overcomes the limitation of prior art systems in which only the gain is varied, with resultant uncontrolled damping shifts. Proper selection of the first filter 16, the second filter 20 and the third filter 26 provide control of both bandwidth and damping. Of course, the preferred embodiment as described above can be extended to other applications requiring a larger bank of filters, where a larger number of bandwidth steps are needed for greater bandwidth control resolution, or a greater range of bandwidth change is required. Alternatively, a simple two filter configuration may be adapted if a two-step bandwidth control is sufficient.

Figure 3:
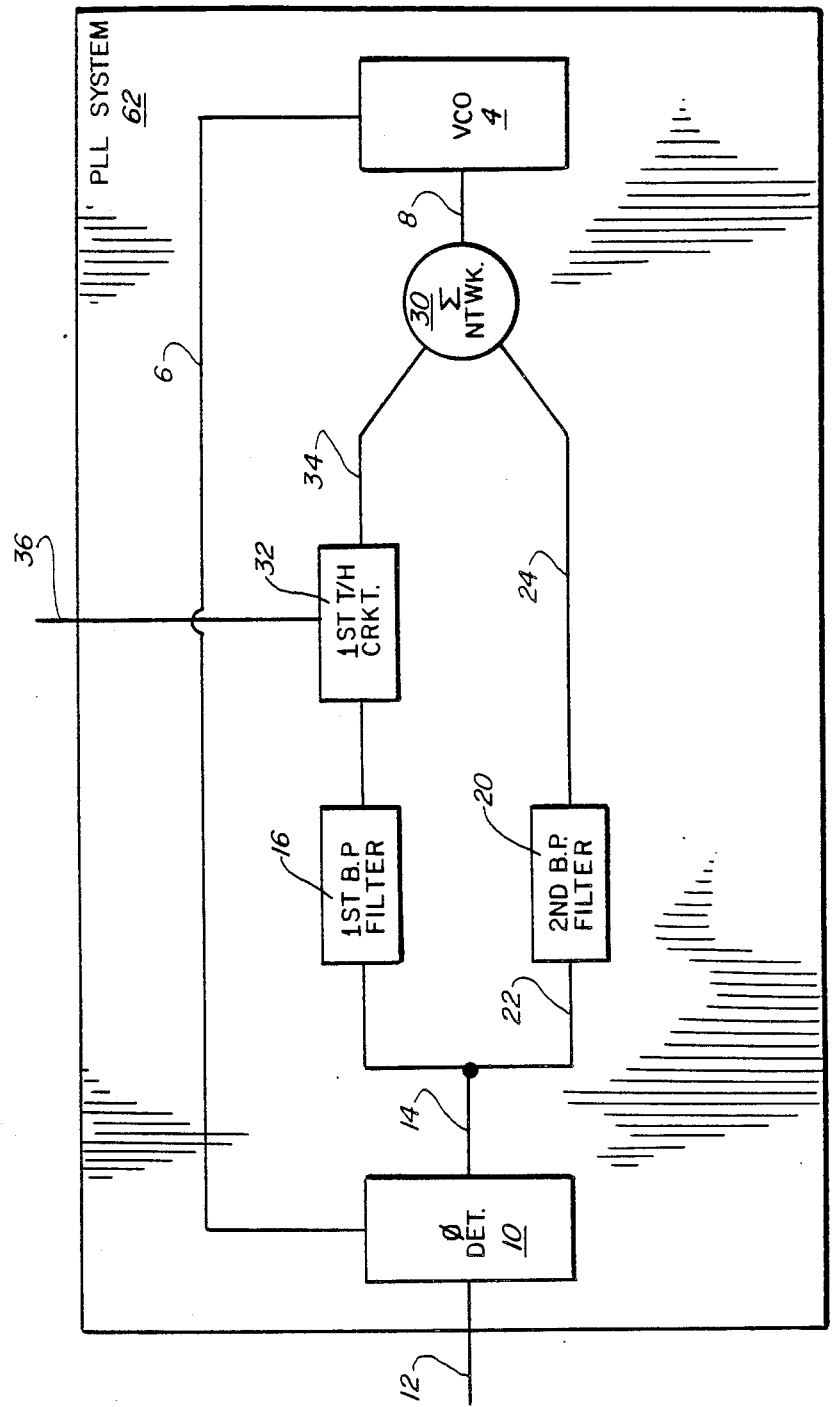
FIG. 3 is a block diagram for an alternate embodiment of the invention.

Such a two-step bandwidth control for a PLL control loop configuration is shown in FIG. 3. A two-step bandpass PLL control system 62 corresponds in all respects to the three-step PLL control system 2 described above, except that the second track/hold circuit 38 is deleted, the summing network 30 need only have two inputs, the second filter output signal on the line 24 feeds directly into one of the inputs for the summing network 30 and the third filter 26 is deleted.

In this case, the bandwidth of the first filter 16 is selected so that the first filter 16 has sufficiently wide bandwidth to allow the control system 62 to phase-lock the output of the VCO 4 on the line 6 during the preamble field, but narrow enough bandwidth to filter out noise in the PLL control signal on the line 14 transmitted from the PLL reference signal on the line 12. The second filter 20 is selected to have a bandwidth which is narrow enough to filter out noise transferred to the PLL control signal on the line 14 in accordance with the requirements for the third filter 26 in the control system 2 described above in connection with FIG. 1.

Figure 4:
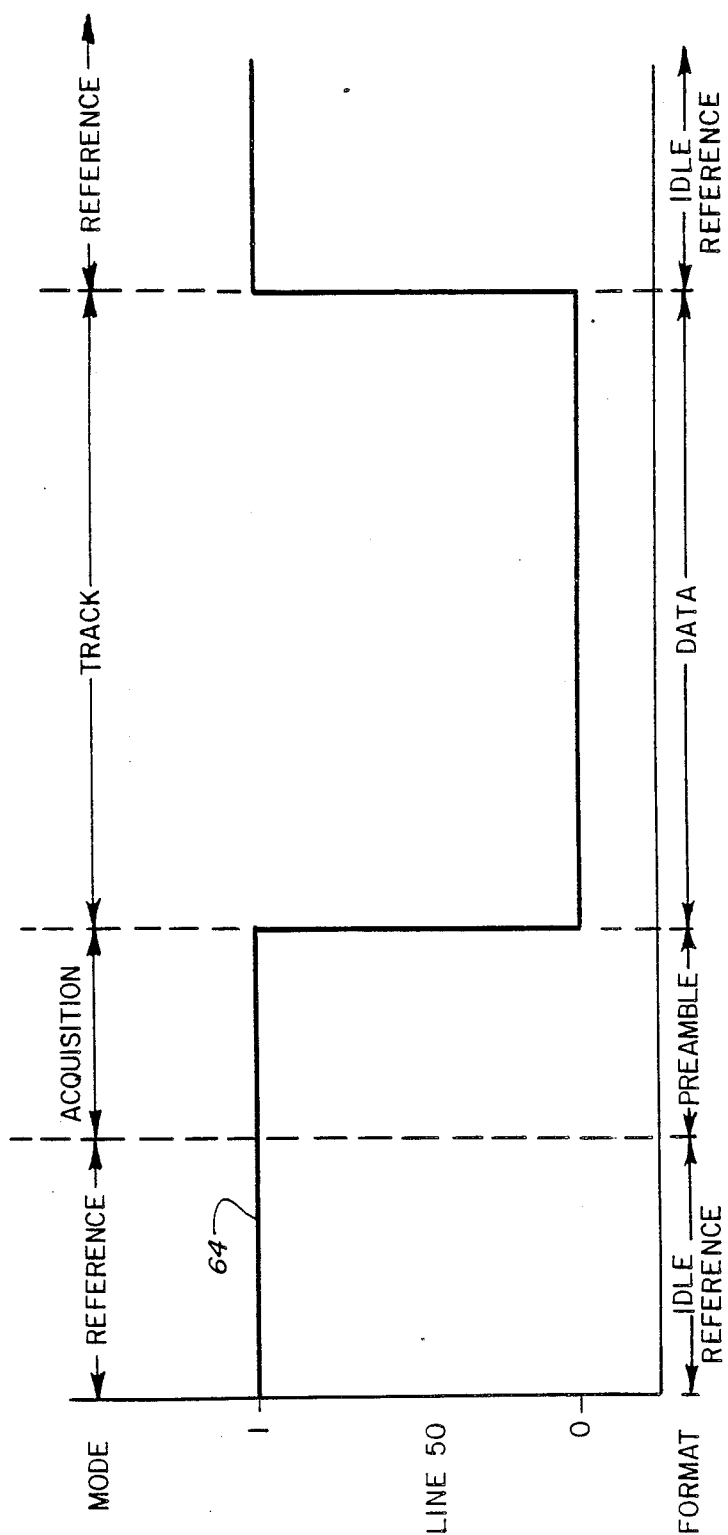
FIG. 4 is a graphical representation of the control signal waveform for the alternate embodiment of the invention shown in FIG. 3.

The first hold control signal on the line 36 is shown as a function of the data format on the disc and the mode of the PLL control system 62 in FIG. 4. A first hold control waveform 64 represents the first hold control signal on the line 36. In FIG. 4, the first hold control signal waveform 64 is indicated to have a level of "1" for the tracking mode and "0" for the holding mode, just a described above in connection with FIG. 2. Of course, the opposite, or different, levels can be used, if convenient, as described above in connection with FIG. 2. Unlike the first hold control signal waveform 36 in FIG. 2, the first hold control signal waveform 64 is asserted at the "1" level for the period of reading the entire preamble, as well as the duration of the preceding standby period. The first hold signal waveform 64 is then shifted to the "0" level for the duration of the data field. If the system operation terminates or the disc drive is shifted to another track, the first hold waveform 64 is then shifted back to the "1" level for beginning the subsequent standby and read process, as shown in FIG. 4.

Figure 5:
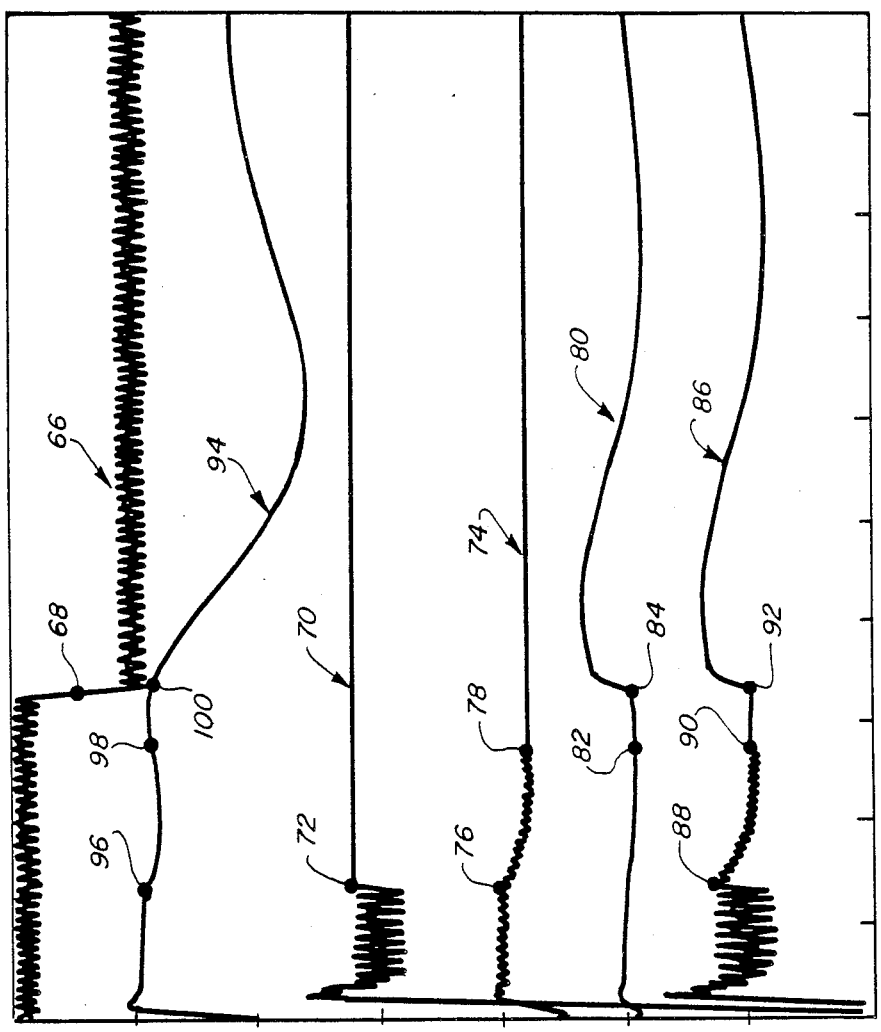
FIG. 5 is a graphical representation of typical system waveforms for the preferred embodiment of the invention shown in FIG. 1.

FIG. 5 shows typical amplitude and phase response characteristics for the preferred embodiment of the present invention shown in FIG. 1. A PLL reference signal waveform 66 represents the phase of the data signal on the line 12, which is shown with a step function phase shift and superimposed extraneous noise, for the purpose of example. The phase shift occurs on the PLL reference signal waveform 66 at the zero axis, representing the start of data phase acquisition, and at a point 68, to illustrate the slower tracking response phase of the PLL.

A first track/hold circuit output waveform 70 represents the amplitude of the output of the first track/hold circuit 32 on the line 36. A point 72 represents the transition of the first track/hold circuit 32 from the tracking mode to the holding mode. The transition represented by the point 72 is shown to occur at the peak noise point so there is a full "held error" to be corrected by subsequent filtering. This is a "worst case" example for this transition, since this the shift will generally fall between the peak noise points. The output level of the first track/hold circuit waveform 70 after the point 72 is a steady state level approximating the peak noise level at the transition represented by the point 72 plus the signal level needed to correct for the non-initial levels of the waveforms 74 and 80.

A second track/hold waveform 74 represents the amplitude of the output of the second track/hold circuit 38 on the line 40. A point 76 represents the transition of the first track/hold circuit 32 from the tracking mode to the holding mode. After the point 76, the second track/hold circuit output waveform 74 dominates the response of the PLL control system 2, which allows it to correct the remaining phase error after the first track/hold circuit 32 switches to the holding mode. This correction occurs until a point 78, which represents the transition of the second track/hold circuit 38 from the tracking mode to the holding mode. Once again, the transition represented by the point 78 is shown to occur at the peak noise level, a worst case condition, and the output level of the waveform 74 thereafter is a steady state level approximating this peak noise level the signal level needed to correct for the held level of the waveform 70 and the non-initial level of the waveform 80. Of course, the noise level is generally much lower for the second track/hold circuit output waveform 74 than the first track/hold circuit output waveform 70, as shown in FIG. 5, because of the greater filtration and higher attenuation factor of the second filter 20 compared to the first filter 16.

A third filter output waveform 80 represents the amplitude of the output of the third filter 26 on the line 29. A point 82 represents the transition of the second track/hold circuit 38 from the tracking mode to the holding mode. After the point 82, the third filter output waveform 80 dominates the PLL control system 2, which allows it to correct the remaining phase error after the second track/hold circuit switches to the holding mode. The point 84 represents the step phase shift of the reference signal waveform 66 at the point 68, and the subsequent portion of the third filter output waveform includes the amplitude level shifts necessary to provide system correction for the step phase shift shown in the PLL reference signal waveform 66. The noise level is reduced and the response to the step phase shift is smoothed by the even greater filtration and reduced gain.

A VCO input signal waveform 86 represents the amplitude of the output of the summing network 30 on the line 8, which in turn represents the combined output of the first track/hold circuit output waveform 70, the second track/hold circuit output waveform 74 and the third filter output waveform 86. A point 88 represents the transition of the first track/hold circuit 32 to the holding mode. A point 90 represents the transition of the second holding circuit 38 to the holding mode. A point 92 represents the step function phase shift of the PLL reference signal waveform 66. It is evident that this composite waveform provides exceptionally fast acquisition time in the acquisition mode with a damped response to reference signal shifts in the tracking mode, without any transients in its response due to final value discontinuities which would occur with ordinary filter switching and no initialization.

A VCO output signal waveform 94 represents the phase of the VCO output signal on the line 6. A point 96 represents the transition of the first track/hold circuit 32 to the holding mode. A point 98 represents the transition of the second track/hold circuit 36 to the holding mode. A point 100 represents the step function phase shift of the waveform 66. The VCO output signal on the line 6, as represented by the VCO output waveform 94, thus combines rapid acquisition with stable and transient-free phase shift response for tracking.

The preferred embodiment described above in connection with FIG. 1 requires that the dynamic range of the first filter 16 and its associated first track/hold circuit 32 be large enough to provide an output on the associated second track/hold circuit 38 on the line 40 and the output of the third filter 26 on the line 29. The potential for interaction limits design choices for the first filter 16, the second filter 20 and the third filter 26 to minimize interaction between them. For instance, the second filter 20 must have a higher attenuation factor than the first filter 16 to ensure that the response of the first filter dominates the PLL control system 2 while the first track/hold circuit 32 is in the track mode. Likewise, the third filter 26 must have a higher attenuation factor than the second filter 20 to ensure that the response of the second filter 20 dominates the PLL control system 2 after the first track hold circuit 32 is in the hold mode and while the second track/hold circuit 38 is in the track mode.

Figure 6:
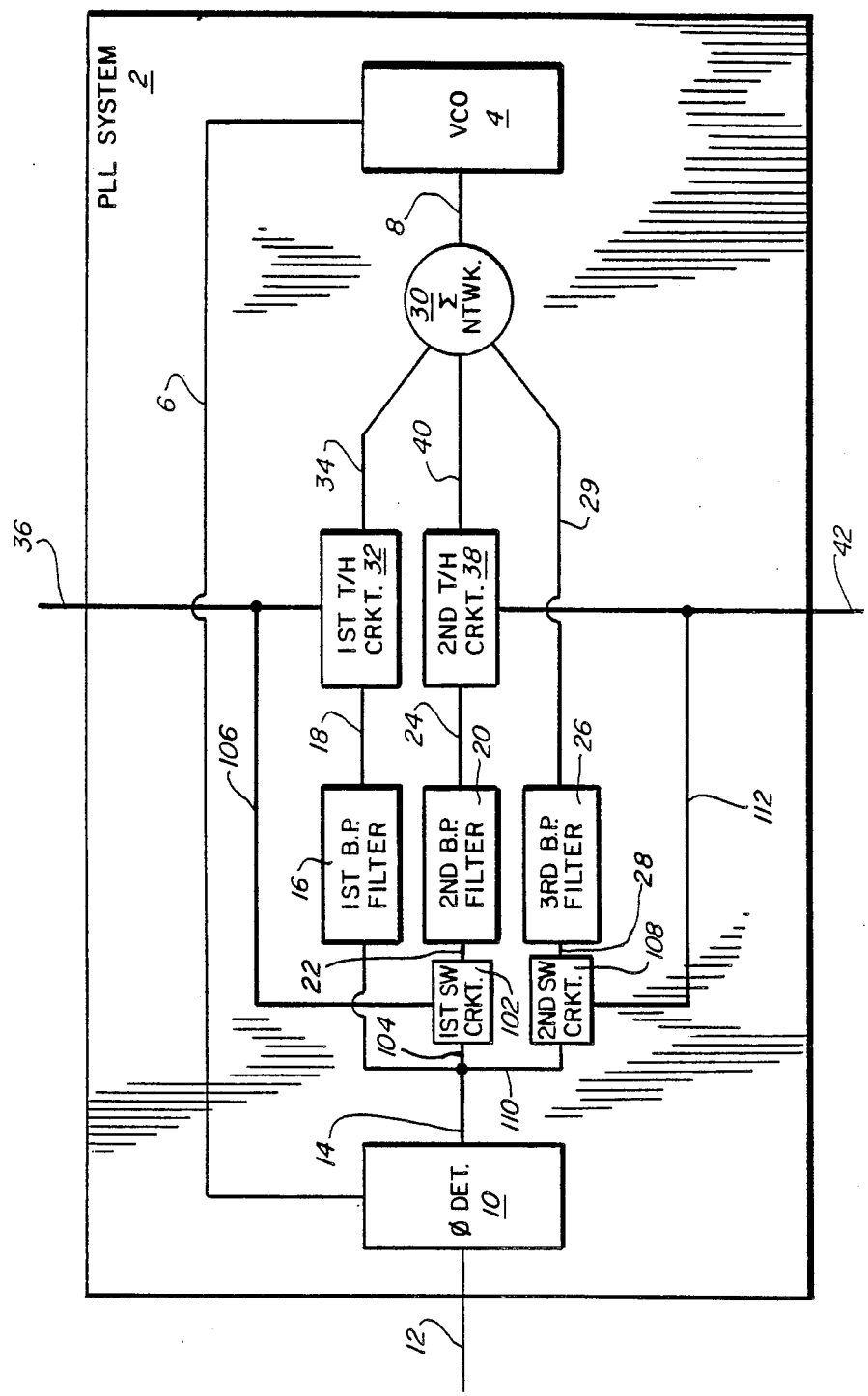
FIG. 6 is a block diagram for another alternate embodiment of the invention.

The above described filter design constraints are eliminated with the alternate embodiment of the present invention shown in FIG. 6. The input of a normally open first switching circuit 102 is coupled to the phase detector output signal on the line 14 via a line 104. The output of the first switching circuit is coupled to the input of the second filter 20 via the line 22. When the first track/hold circuit 32 switches to the hold mode in response to the first track/hold control signal on the line 36, the first switching circuit 102 is closed in response to the first track/hold control signal on the line 36 which is coupled to a control signal input on the first switching circuit 102 via a line 106.

The input of a normally open second switching circuit 108 is coupled to the phase detector output signal on the line 14 via a line 110. The output of the second switching circuit 108 is coupled to the input of the third filter 26 via the line 28. When the second track/hold circuit 38 switches to the hold mode in response to the second track/hold control signal on the line 42, the second switching circuit 108 is closed in response to the second track/hold control signal on the line 42 which is coupled to a control signal input on the second switching circuit 108 via a line 112. The arrangement of the other components in this embodiment is otherwise the same as described above for the preferred embodiment in connection with FIG. 1.

With this embodiment, the second filter 20 is not coupled to the phase detector output signal on the line 14 until the first track/hold control signal on the line 36 is asserted. The second filter 20 is coupled into the control system 2 only when the output of the first filter 16 is held by the first track/hold circuit 32. In this way, the first filter 16 compensates for output error of the second filter 20 and the third filter 26, but the second filter 20 and the third filter 26 do not affect the dynamic response of the PLL control system 2 until the first track/hold circuit 32 is switched to the hold mode.

Likewise, the third filter 26 is not coupled to the phase detector output signal on the line 14 until the second track hold signal on the line 42 is asserted. The third filter 26 is coupled into the control system 2 only when the output of the second filter 20 is held by the second track/hold circuit 38. In this way, the second filter 20 compensates for output error of the third filter 26, but the third filter 26 does not affect the dynamic response of the PLL control system 2 until the second track/hold circuit 38 is switched to the hold mode. Consequently, the characteristics of the first filter 16, the second filter 20 and the third filter 26 may each be designed for optimum response in each time zone.

Thus, there has been described herein a method and apparatus for providing selectable bandwidth signal filtering without switching transients by providing common inputs for a plurality of different filtering paths of varying bandwidth, combining their outputs to form a filtered output signal, and selectively holding the value of one or more of the filtering path outputs to change the effective bandwidth of the multiple filtering path combination. Although described in connection with a phase-locked loop control system application, it is generally applicable to any feedback control system requiring bandpass filter switching.

It will be understood that various changes in the details, arrangements and configurations of the parts and systems which have been described and illustrated above in order to explain the nature of the present invention may be made by those skilled in the art within the principle and scope of the present invention as expressed in the appended claims.

What is claimed is:

1. A method of sequentially filtering an input signal having a frequency range through a plurality of filters, each filter having a passband ranging from a widest passband with a widest selected frequency range to a narrowest passband with a narrowest selected frequency range, comprising the steps of:
coupling said input signal to the input of each said filter;
combining the outputs of said filters to form a filtered output signal having a frequency range corresponding to said widest passband filter; and
sequentially holding the output level of each of said filters in declining order of their passband frequency range, beginning from said widest passband filter to said narrowest passband filter until all of the output levels of said filters are held constant except for said narrowest passband filter, for sequentially changing the frequency range of said filtered output signal from the frequency range of said widest passband filter to the frequency range of said narrowest passband filter.

2. The method recited in claim 1, wherein said step of sequentially holding the output level of each of said filters includes the step of timing said holding sequence to sequentially narrow the frequency range of said filtered output signal.

3. The method recited in claim 1, further comprising the step of attenuating the output of each of said filters with a filter attenuation factor having an inverse relationship to said filter passband.

4. The method recited in claim 1, wherein said selected number of frequency ranges is three.

5. The method recited in claim 1, wherein said selected number of frequency ranges is two.

6. For a phase-locked loop (PLL) control system incorporated in a data storage disc drive, including a PLL reference signal read from a disc in said disc drive and a PLL control signal proportional to the difference in phase between said PLL reference signal and an output signal of a voltage-controlled oscillator (VCO) in said disc drive for frequency control of said VCO, a method of filtering said PLL control signal through a selected number of frequency ranges with a corresponding number of filters having bandpass characteristics corresponding to said selected frequency ranges from a widest passband with a widest selected frequency range to a narrowest passband with a narrowest selected frequency range, comprising the steps of:
coupling said PLL control signal to the inputs of said filters;
combining the outputs of said filters to form a filtered PLL control signal with a frequency range corresponding to said widest passband filter; and
sequentially holding the output levels of each of said filters in order of their progressively narrowing passbands from said widest passband filter to said narrowest passband filter until all of the output levels of said filters are held constant except for said narrowest passband filter, for sequentially changing the frequency range of said filtered PLL control signal from the frequency range of said widest passband filter through said selected number of frequency ranges to the frequency range of said narrowest passband filter.

7. The method recited in claim 6, wherein said step of sequentially holding said filter output levels includes the step of timing said holding sequence to sequentially narrow the frequency range of said filtered PLL control signal in a step-wise pattern through said selected number of frequency ranges according to a timed sequence.

8. The method recited in claim 6, further comprising the step of attenuating the output of each of said filters with an attenuation factor of each said filter having an inverse relationship to said filter passband.

9. The method recited in claim 6, wherein said selected number of frequency ranges is three.

10. The method recited in claim 6, wherein said selected number of frequency ranges is two.

11. For a phase-locked loop (PLL) control system incorporated in a data storage disc drive, including a PLL reference signal read from a disc in said disc drive and a PLL control signal proportional to the difference in phase between said PLL reference signal and an output signal of a voltage-controlled oscillator (VCO) in said disc drive for frequency control of said VCO, a method of filtering said PLL control signal sequentially through a widest selected frequency range, an intermediate selected frequency range, and a narrowest selected frequency range with a widest passband filter corresponding in frequency range to said widest selected frequency range, an intermediate passband filter corresponding in frequency range to said intermediate selected frequency range, and a narrowest passband filter corresponding in frequency range to said narrowest selected frequency range, comprising the steps of:

coupling said PLL control signal to the inputs of said filters;

attenuating the output of each of said filters with said widest passband filter having a lowest attenuation factor, said intermediate passband filter having an intermediate attenuation factor and said narrowest passband filter having a highest attenuation factor;

combining the outputs of said filters to form a filtered PLL control signal with a frequency range corresponding to said widest selected frequency range; and sequentially holding the output level of said widest passband filter after a first selected interval and then after a second selected interval, holding the output level of both said widest passband filter and said intermediate passband filter, for sequentially changing the frequency range of said filtered PLL control signal from the frequency range of said widest passband filter to the frequency range of said intermediate passband filter after said first interval and to the frequency range of said narrowest passband filter after said second interval.

12. Apparatus for sequentially filtering an input signal with an input signal frequency range through a selected number of frequency ranges narrower than said input signal frequency range, comprising:

a plurality of filters for receiving said input signal, each one of said plurality of filters having a bandpass characteristic corresponding to a different one of a selected number of frequency ranges from a widest passband with a widest selected frequency range to a narrowest passband with a narrowest selected frequency range;

means for combining the outputs of said filters to form a filtered output signal with a frequency range corresponding to said widest passband filter; and means for sequentially holding the output levels of each of said filters in order of their progressively narrowing passbands, from said widest passband filter to said narrowest passband filter, until all of the output levels of said filters are held constant except for said narrowest passband filter, for sequentially changing the frequency range of said filtered output signal from the frequency range of said widest passband filter through said selected number of frequency ranges to the frequency range of said narrowest passband filter.

13. The apparatus recited in claim 12, wherein said means for combining comprises a summing network having a plurality of inputs corresponding in number to said selected number of frequency ranges and a single output for said filtered output signal.

14. The apparatus recited in claim 12, wherein said means for sequentially holding comprises a plurality of track/hold circuits for selectively holding the output levels of each of said filters in order of their progressive narrowing passbands, each of said track/hold circuits having an input coupled to the output of a different one of said bank plurality of filters and an output which selectively tracks or holds the output of its corresponding one of said filters in response to a corresponding hold control signal.

15. The apparatus recited in claim 12, wherein each of said filters has a different corresponding attenuation factor, with said filter attenuation factor of each said filter having an inverse relationship to said filter passband.

16. The apparatus recited in claim 12, wherein said selected number of frequency range is three.

17. The apparatus recited in claim 12, wherein said selected number of frequency ranges is two.

18. A phase-locked loop (PLL) control system incorporated in a data storage disc drive, including a PLL reference signal read from a disc in said disc drive and a PLL control signal proportional to the difference in phase between said PLL reference signal and an output signal of a voltage-controlled oscillator (VCO) in said disc drive for frequency control of said VCO, and an apparatus for filtering said PLL control signal through a selected number of frequency ranges from a widest frequency range to a narrowest frequency range comprising:

a plurality of filters for receiving said PLL reference signal, each of said plurality of filters having a bandpass characteristic corresponding to a different one of said frequency ranges from a widest passband filter having a widest selected frequency range to a narrowest passband filter having a narrowest selected frequency range;

means for combining the outputs of said filters to form a filtered PLL control signal with a frequency range corresponding to said widest passband filter; and means for sequentially holding the output levels of each of said filters in order of their progressively narrowing passbands, from said widest passband filter to said narrowest frequency filter until all of the output levels of said filters are held constant except for said narrowest passband filter for sequentially changing the frequency range of said filtered PLL control signal from the frequency range of said widest passband filter through said selected number of frequency ranges to the frequency range of said narrowest frequency range filter.

19. The apparatus recited in claim 18, wherein said means for combining comprises a summing network having a plurality of inputs corresponding in number to said selected number of frequency ranges and a single output for said filtered PLL control signal.

20. The apparatus recited in claim 18, wherein said means for sequentially holding comprises a plurality of track/hold circuits for selectively holding the output levels of each of said filters in order of their progressively narrowing passbands, each of said track/hold circuits having an input coupled to the output of a different one of said plurality of filters and an output which selectively tracks or holds the output of its corresponding one of said filters in response to a corresponding hold control signal.

21. The apparatus recited in claim 18, wherein each of said filters has an attenuation factor, with said filter attenuation factor of each said filter having inverse relationship to said filter passband.

22. The apparatus recited in claim 18, wherein said selected number of frequency ranges is three.

23. The apparatus recited in claim 18, wherein said selected number of frequency ranges is two.

24. Apparatus for filtering a phase-locked loop (PLL) control signal sequentially through a widest selected frequency range, an intermediate selected frequency range and a narrowest selected frequency range in a PLL control system incorporated in a data storage disc drive, having a PLL reference signal read from a disc in said disc drive, said PLL control signal proportional to the difference in phase between said PLL reference signal and an output signal of a voltage-controlled oscillator (VCO) in said disc drive for frequency control of said VCO, said apparatus comprising:

a widest passband filter having a passband corresponding in frequency range to said widest selected frequency range having both an input for said PLL control signal and a low selected attenuation factor;

an intermediate passband filter having a passband corresponding in frequency range to said intermediate selected frequency range and having both a common input with said widest passband filter and an intermediate selected attenuation factor;

a narrowest passband filter corresponding in frequency range to said narrowest selected frequency range and having both a common input with said widest passband filter and a high selected attenuation factor;

a summing network for combining the outputs of said filters to form a filtered PLL control signal with a frequency range corresponding to said widest passband filter;

a first track/hold circuit coupled to said widest passband filter for selectively holding the output level of said widest passband filter in response to a first hold signal to change the frequency range of said filtered PLL control signal to correspond to said intermediate selected frequency range; and a second track/hold circuit coupled to said intermediate frequency range filter for selectively holding the output level of said intermediate passband filter in response to a second hold signal while the output of said widest passband filter is held to change the frequency range of said filtered PLL control signal to correspond to said narrowest selected frequency range.

* * * * *

UNITED STATES PATENT AND TRADEMARK OFFICE
CERTIFICATE OF CORRECTION

PATENT NO. : 4,928,075

DATED : May 22, 1990

INVENTOR(S) : Michael D. Leis

It is certified that error appears in the above-identified patent and that said Letters Patent is hereby corrected as shown below:

column 14, line 1, delete "bank".

Signed and Sealed this

Eighteenth Day of August, 1992

*Attest:*

DOUGLAS B. COMER

*Attesting Officer*     *Acting Commissioner of Patents and Trademarks*